(12) United States Patent
Armijo et al.

(10) Patent No.: US 7,874,493 B2
(45) Date of Patent: Jan. 25, 2011

(54) METHOD OF MANUFACTURING RFID DEVICES

(75) Inventors: Edward A. Armijo, Fountain Inn, SC (US); John F. Hughen, Lake Havasu City, AZ (US); Steven C. Kennedy, Simpsonville, SC (US); Samuel A. Linder, Moore, SC (US); Jason D. Munn, Clinton, SC (US)

(73) Assignee: Avery Dennison Corporation, Pasadena, CA (US)

( * ) Notice: Subject to any disclaimer, the term of this patent is extended or adjusted under 35 U.S.C. 154(b) by 0 days.

(21) Appl. No.: 12/474,300

(22) Filed: May 29, 2009

(65) Prior Publication Data

US 2009/0230198 A1 Sep. 17, 2009

Related U.S. Application Data

(62) Division of application No. 11/315,504, filed on Dec. 22, 2005, now Pat. No. 7,555,826.

(51) Int. Cl.
*G06K 19/00* (2006.01)

(52) U.S. Cl. .................. 235/492; 340/572.1; 340/572.7

(58) Field of Classification Search ................. 235/492; 340/572.1, 572.7
See application file for complete search history.

(56) References Cited

U.S. PATENT DOCUMENTS

| | | |
|---|---|---|
| 3,724,737 A | 4/1973 | Bodnar |
| 3,891,157 A | 6/1975 | Justus |
| 3,989,575 A | 11/1976 | Davies et al. |
| 4,242,663 A | 12/1980 | Slobodin |
| 4,480,742 A | 11/1984 | Muylle |
| 4,818,312 A | 4/1989 | Benge |
| 4,910,499 A | 3/1990 | Benge et al. |
| 5,153,983 A | 10/1992 | Oyama |
| 5,264,061 A | 11/1993 | Juskey et al. |

(Continued)

FOREIGN PATENT DOCUMENTS

DE 196 34 473 8/1996

(Continued)

OTHER PUBLICATIONS

Sanjay Sarma, Auto-ID Center, Published Nov. 1, 2001, pp. 1-19, "White Paper—Towards the 5¢ Tag."

(Continued)

*Primary Examiner*—Allyson N Trail

(57) ABSTRACT

A method of making RFID devices includes feeding in an interposer web or sheet at a variable (non-constant) speed, cutting single interposers from the interposer web or sheet, and using a rotary transport device to transport the singulated (cut) interposers to an antenna web. The interposers are transferred from the rotary transport device and are attached to the antenna web, being operatively coupled to antennas on the antenna web. The interposers each include an RFID transponder chip and conductive leads. A feeder is used to advance the interposer web or sheet into a cutting zone between the rotary cutter and the rotary transport device. The rotary cutting device may be capable of singulating multiple interposers at one time, and the system may be capable of thus being able to remove interposers that are not to be joined to the antenna web.

17 Claims, 5 Drawing Sheets

U.S. PATENT DOCUMENTS

| | | |
|---|---|---|
| 5,411,779 A | 5/1995 | Nakajima et al. |
| 5,519,381 A | 5/1996 | Marsh et al. |
| 5,528,222 A | 6/1996 | Moskowitz et al. |
| 5,537,105 A | 7/1996 | Marsh et al. |
| 5,545,291 A | 8/1996 | Smith et al. |
| 5,550,547 A | 8/1996 | Chan et al. |
| 5,557,280 A | 9/1996 | Marsh et al. |
| 5,564,888 A | 10/1996 | Doan |
| 5,566,441 A | 10/1996 | Marsh et al. |
| 5,585,193 A | 12/1996 | Joseph et al. |
| 5,612,513 A | 3/1997 | Tuttle et al. |
| 5,613,228 A | 3/1997 | Tuttle et al. |
| 5,645,932 A | 7/1997 | Uchibori |
| 5,682,143 A | 10/1997 | Brady et al. |
| 5,728,599 A | 3/1998 | Rostoker et al. |
| 5,783,856 A | 7/1998 | Smith et al. |
| 5,824,186 A | 10/1998 | Smith et al. |
| 5,837,349 A | 11/1998 | Van Erden et al. |
| 5,904,545 A | 5/1999 | Smith et al. |
| 5,939,984 A | 8/1999 | Brady et al. |
| 5,946,198 A | 8/1999 | Hoppe et al. |
| 5,963,177 A | 10/1999 | Tuttle et al. |
| 5,972,152 A | 10/1999 | Lake et al. |
| 5,972,156 A | 10/1999 | Brady et al. |
| 5,982,284 A | 11/1999 | Baldwin et al. |
| 5,982,628 A | 11/1999 | Houdeau et al. |
| 6,018,299 A | 1/2000 | Eberhardt |
| 6,019,865 A | 2/2000 | Palmer et al. |
| 6,027,027 A | 2/2000 | Smithgall |
| 6,043,746 A | 3/2000 | Sorrells |
| 6,045,652 A | 4/2000 | Tuttle et al. |
| 6,078,259 A | 6/2000 | Brady et al. |
| 6,081,243 A | 6/2000 | Lake |
| 6,082,660 A | 7/2000 | Meyer |
| 6,091,332 A | 7/2000 | Eberhardt et al. |
| 6,094,138 A | 7/2000 | Eberhardt et al. |
| 6,104,291 A | 8/2000 | Beauvillier et al. |
| 6,107,920 A | 8/2000 | Eberhardt et al. |
| 6,121,878 A | 9/2000 | Brady et al. |
| 6,140,146 A | 10/2000 | Brady et al. |
| 6,145,901 A | 11/2000 | Rich |
| 6,147,605 A | 11/2000 | Vega et al. |
| 6,147,662 A | 11/2000 | Grabau et al. |
| 6,163,260 A | 12/2000 | Conwell et al. |
| 6,164,137 A | 12/2000 | Hancock et al. |
| 6,164,551 A | 12/2000 | Altwasser |
| 6,165,386 A | 12/2000 | Endo et al. |
| 6,177,859 B1 | 1/2001 | Tuttle et al. |
| 6,189,208 B1 | 2/2001 | Estes et al. |
| 6,206,292 B1 | 3/2001 | Robertz et al. |
| 6,215,401 B1 | 4/2001 | Brady et al. |
| 6,246,326 B1 | 6/2001 | Wiklof et al. |
| 6,246,327 B1 | 6/2001 | Eberhardt |
| 6,252,508 B1 | 6/2001 | Vega et al. |
| 6,259,369 B1 | 7/2001 | Monico |
| 6,259,408 B1 | 7/2001 | Brady et al. |
| 6,262,692 B1 | 7/2001 | Babb |
| 6,265,977 B1 | 7/2001 | Vega et al. |
| 6,271,793 B1 | 8/2001 | Brady et al. |
| 6,271,801 B2 | 8/2001 | Tuttle et al. |
| 6,274,508 B1 | 8/2001 | Jacobsen et al. |
| 6,278,413 B1 | 8/2001 | Hugh et al. |
| 6,280,544 B1 | 8/2001 | Fox et al. |
| 6,281,036 B1 | 8/2001 | Niki et al. |
| 6,281,038 B1 | 8/2001 | Jacobsen |
| 6,281,795 B1 | 8/2001 | Smith et al. |
| 6,320,556 B1 | 11/2001 | Cyman et al. |
| 6,331,221 B1 | 12/2001 | Cobbley |
| 6,342,843 B1 | 1/2002 | Hahn et al. |
| 6,366,260 B1 | 4/2002 | Carrender |
| 6,371,375 B1 | 4/2002 | Ackley et al. |
| 6,384,727 B1 | 5/2002 | Diprizio et al. |
| 6,392,545 B1 | 5/2002 | Lake et al. |
| 6,406,935 B2 | 6/2002 | Kayanakis et al. |
| 6,410,112 B1 | 6/2002 | Hatfield |
| 6,412,086 B1 | 6/2002 | Friedman et al. |
| 6,416,608 B1 | 7/2002 | Mynott et al. |
| 6,424,263 B1 | 7/2002 | Lee et al. |
| 6,451,154 B1 | 9/2002 | Grabau et al. |
| 6,452,496 B1 | 9/2002 | Van Horn et al. |
| 6,487,681 B1 | 11/2002 | Tuttle et al. |
| 6,496,113 B2 | 12/2002 | Lee et al. |
| 6,501,157 B1 | 12/2002 | Cobbley |
| 6,514,790 B1 | 2/2003 | Plettner et al. |
| 6,549,176 B2 | 4/2003 | Hausladen |
| 6,557,758 B1 | 5/2003 | Minoco |
| 6,606,247 B2 | 8/2003 | Credelle et al. |
| 6,618,939 B2 | 9/2003 | Uchibori et al. |
| 6,630,887 B2 | 10/2003 | Lake |
| 6,630,910 B2 | 10/2003 | Forster et al. |
| 6,645,327 B2 | 11/2003 | Austin et al. |
| 6,646,554 B1 | 11/2003 | Goff et al. |
| 6,662,430 B2 | 12/2003 | Brady et al. |
| 6,665,193 B1 | 12/2003 | Chung et al. |
| 6,696,952 B2 | 2/2004 | Zirbes |
| 6,717,923 B1 | 4/2004 | Smith |
| 6,720,865 B1 | 4/2004 | Forster et al. |
| 6,739,047 B2 | 5/2004 | Hammond et al. |
| 6,779,246 B2 | 8/2004 | Debraal |
| 6,781,508 B2 | 8/2004 | Tuttle et al. |
| 6,786,419 B2 | 9/2004 | Kayanakis |
| 6,796,508 B2 | 9/2004 | Muller |
| 6,798,121 B2 | 9/2004 | Nakatani et al. |
| 6,809,045 B1 | 10/2004 | Alam et al. |
| 6,816,380 B2 | 11/2004 | Credelle et al. |
| 6,820,314 B2 | 11/2004 | Ferguson et al. |
| 6,838,989 B1 | 1/2005 | Mays et al. |
| 6,891,110 B1 | 5/2005 | Pennaz et al. |
| 6,951,596 B2 | 10/2005 | Green et al. |
| 7,368,032 B2 | 5/2008 | Green et al. |
| 2001/0030628 A1 | 10/2001 | Brady et al. |
| 2001/0053675 A1 | 12/2001 | Plettner |
| 2002/0011677 A1 | 1/2002 | Yokoi et al. |
| 2002/0049093 A1 | 4/2002 | Reyes et al. |
| 2002/0067268 A1 | 6/2002 | Lee et al. |
| 2002/0082368 A1 | 6/2002 | Zahalka |
| 2002/0129488 A1 | 9/2002 | Lieberman |
| 2002/0152860 A1 | 10/2002 | Machamer |
| 2002/0167405 A1 | 11/2002 | Shanks et al. |
| 2002/0171591 A1 | 11/2002 | Beard |
| 2002/0195194 A1 | 12/2002 | Grabau et al. |
| 2002/0195195 A1 | 12/2002 | Grabau et al. |
| 2003/0034127 A1 | 2/2003 | Segawa |
| 2003/0036249 A1 | 2/2003 | Bauer et al. |
| 2003/0062783 A1 | 4/2003 | Horng et al. |
| 2003/0080919 A1 | 5/2003 | Forster et al. |
| 2003/0089444 A1 | 5/2003 | Melzer et al. |
| 2003/0102541 A1 | 6/2003 | Gore et al. |
| 2003/0117334 A1 | 6/2003 | Forster et al. |
| 2003/0121986 A1 | 7/2003 | Stromberg et al. |
| 2003/0132893 A1 | 7/2003 | Forster et al. |
| 2003/0136503 A1 | 7/2003 | Green et al. |
| 2003/0151028 A1 | 8/2003 | Lawrence et al. |
| 2003/0153269 A1 | 8/2003 | Smit et al. |
| 2003/0209697 A1 | 11/2003 | Orsbon et al. |
| 2004/0004295 A1 | 1/2004 | Stromberg et al. |
| 2004/0005754 A1 | 1/2004 | Stromberg |
| 2004/0032377 A1 | 2/2004 | Forster et al. |
| 2004/0037053 A1 | 2/2004 | Akita et al. |
| 2004/0040740 A1 | 3/2004 | Nakatani et al. |
| 2004/0041739 A1 | 3/2004 | Forster et al. |
| 2004/0061655 A1 | 4/2004 | Forster et al. |
| 2004/0061994 A1 | 4/2004 | Kerr et al. |
| 2004/0072385 A1 | 4/2004 | Bauer et al. |

| | | | | | |
|---|---|---|---|---|---|
| 2004/0075616 A1 | 4/2004 | Endo et al. | JP | 2003-059337 | 2/2003 |
| 2004/0089408 A1 | 5/2004 | Brod et al. | JP | 2003-281936 | 3/2003 |
| 2004/0102870 A1 | 5/2004 | Andersen et al. | JP | 2003-281491 | 10/2003 |
| 2004/0117985 A1 | 6/2004 | Chung et al. | JP | 2003-283120 | 10/2003 |
| 2004/0151028 A1 | 8/2004 | Chih et al. | JP | 2003-283121 | 10/2003 |
| 2004/0154161 A1 | 8/2004 | Aoyama et al. | JP | 2003-288570 | 10/2003 |
| 2004/0155328 A1 | 8/2004 | Kline | JP | 2004-038573 | 2/2004 |
| 2004/0173781 A1 | 9/2004 | Lawrence et al. | JP | 2004-180217 | 6/2004 |
| 2004/0175515 A1 | 9/2004 | Lawrence et al. | JP | 2004-220304 | 8/2004 |
| 2004/0175548 A1 | 9/2004 | Lawrence et al. | JP | 2004-334432 | 11/2004 |
| 2004/0175550 A1 | 9/2004 | Lawrence et al. | JP | 2005-311179 | 11/2005 |
| 2004/0176032 A1 | 9/2004 | Kotola et al. | WO | 00/14733 | 3/2000 |
| 2004/0183182 A1 | 9/2004 | Swindlehurst et al. | WO | 00/16285 | 3/2000 |
| 2004/0188531 A1 | 9/2004 | Gengel et al. | WO | 00/21031 | 4/2000 |
| 2004/0192011 A1 | 9/2004 | Roesner | WO | 00/46854 | 8/2000 |
| 2004/0194876 A1 | 10/2004 | Overmeyer et al. | WO | 00/49421 | 8/2000 |
| 2004/0201112 A1 | 10/2004 | Divigalpitiya et al. | WO | 00/49658 | 8/2000 |
| 2004/0212544 A1 | 10/2004 | Pennaz et al. | WO | 00/55915 | 9/2000 |
| 2004/0215350 A1 | 10/2004 | Roesner | WO | 00/55916 | 9/2000 |
| 2004/0246099 A1 | 12/2004 | Tuttle | WO | 01/33621 | 5/2001 |
| 2005/0001725 A1 | 1/2005 | Brady et al. | WO | 01/54058 | 7/2001 |
| 2005/0007296 A1 | 1/2005 | Endo et al. | WO | 01/61646 | 8/2001 |
| 2005/0021172 A1 | 1/2005 | Winter et al. | WO | 01/95241 | 12/2001 |
| 2005/0024291 A1 | 2/2005 | Aisenbrey | WO | 02/37414 | 5/2002 |
| 2005/0076206 A1 | 4/2005 | Javanainen | WO | 02/49093 | 6/2002 |
| 2005/0155213 A1 | 7/2005 | Eastin | WO | 02/082368 | 10/2002 |
| 2005/0282355 A1* | 12/2005 | Edwards et al. ............. 438/455 | WO | 02/093625 | 11/2002 |
| 2007/0216534 A1* | 9/2007 | Ferguson et al. ......... 340/572.7 | WO | 03/007232 | 1/2003 |
| | | | WO | 03/071476 | 8/2003 |

FOREIGN PATENT DOCUMENTS

| | | |
|---|---|---|
| DE | 198 05 031 | 2/1998 |
| DE | 198 40 226 | 9/1998 |
| DE | 101 20 269 | 7/2002 |
| DE | 10 2004 015 994 | 4/2004 |
| EP | 0 902 475 | 9/1998 |
| EP | 0 979 790 | 7/1999 |
| EP | 1 039 543 | 9/2000 |
| EP | 1 479 040 | 2/2003 |
| EP | 1 341 138 | 9/2003 |
| FR | 2 775 533 | 9/1999 |
| JP | 2001-035989 | 2/2001 |
| JP | 2002-298104 | 10/2002 |
| JP | 2002-298107 | 10/2002 |
| JP | 2003-006594 | 1/2003 |
| WO | 03/107266 | 12/2003 |
| WO | 2004/046762 | 6/2004 |
| WO | 2004/079646 | 9/2004 |
| WO | 2004/084128 | 9/2004 |
| WO | 2004/100098 | 11/2004 |
| WO | 2004/100309 | 11/2004 |
| WO | 2005/006248 | 1/2005 |
| WO | 2005/096221 | 10/2005 |
| WO | 2006/116586 | 11/2006 |

OTHER PUBLICATIONS

International Search Report from corresponding International Application No. PCT/US2006/47697.

* cited by examiner

METHOD OF MANUFACTURING RFID DEVICES

CROSS-REFERENCE TO RELATED APPLICATION

This application is a division of U.S. application Ser. No. 11/315,504 filed Dec. 22, 2005, which is incorporated herein by reference in its entirety.

FIELD OF THE INVENTION

This invention relates to the field of radio frequency identification (RFID) devices, and a method of manufacturing such devices.

DESCRIPTION OF THE RELATED ART

RFID tags and labels have a combination of antennas and analog and/or digital electronics, which may include for example communications electronics, data memory, and control logic. RFID tags and labels are widely used to associate an object with an identification code. For example, RFID tags are used in conjunction with security-locks in cars, for access control to buildings, and for tracking inventory and parcels. Some examples of RFID tags and labels appear in U.S. Pat. Nos. 6,107,920, 6,206,292, and 6,262,692.

RFID tags and labels include active tags, which include a power source, and passive tags and labels, which do not. In the case of passive tags, in order to retrieve the information from the chip, a "base station" or "reader" sends an excitation signal to the RFID tag or label. The excitation Signal energizes the tag or label, and the RFID circuitry transmits the stored information back to the reader. The "reader" receives and decodes the information from the RFID tag. In general, RFID tags can retain and transmit enough information to uniquely identify individuals, packages, inventory and the like. RFID tags and labels also can be characterized as those to which information is written only once (although the information may be read repeatedly), and those to which information may be written during use. For example, RFID tags may store environmental data (that may be detected by an associated sensor), logistical histories, state data, etc.

Methods for manufacturing RFID labels are disclosed in PCT Publication No. WO 01/61646 by Moore North America, Inc. The method disclosed in PCT Publication No. WO 01/61646 uses a number of different sources of RFID inlets, each inlet including an antenna and a chip. A plurality of webs are matched together and RFID labels are die cut from the webs, to produce RFID labels with liners. Alternatively, linerless, RFID labels are produced from a composite web with a release material on one face and pressure sensitive adhesive on the other, the labels formed by perforations in the web. Various alternatives are possible.

Still other RFID devices and methods for manufacturing RFID labels are disclosed in United States Patent Application Publication No. US2001/0053675 by Plettner. The devices include a transponder comprising a chip having contact pads and at least two coupling elements, which are conductively connected with the contact pads. The coupling elements are touch-free relative to each other and formed in a self-supported as well as a free-standing way and are essentially extended parallel to the chip plane. The total mounting height of the transponder corresponds essentially to the mounting height of the chip. The size and geometry of the coupling elements are adapted for acting as a dipole antenna or in conjunction with an evaluation unit as a plate capacitor. Typically, the transponders are produced at the wafer level. The coupling elements can be contacted with the contact pads of the chip directly at the wafer level, i.e., before the chips are extracted from the grouping given by the wafer.

In many applications, it is desirable to reduce the size of the electronics as small as possible. In order to interconnect very small chips with antennas in RFID inlets, it is known to use a structure variously called "straps", "interposers", and "carriers" to facilitate inlay manufacture. Interposers include conductive leads or pads that are electrically coupled to the contact pads of the chips for coupling to the antennas. These pads provide a larger effective electrical contact area than ICs precisely aligned for direct placement without an interposer. The larger area reduces the accuracy required for placement of ICs during manufacture while still providing effective electrical connection. IC placement and mounting are serious limitations for high-speed manufacture. The prior art discloses a variety of RFID strap or interposer structures, typically using a flexible substrate that carries the interposer's contact pads or leads.

One type of prior art RFID inlet manufacture using interposers is disclosed in European Patent Application EP 1039543 A2 to Morgan Adhesives Company ("Morgan"). This patent application discloses a method of mounting an integrated circuit chip (IC) using an interposer connected across a gap between two thin conductive film sections of a conductive film antenna. The interposer comprises a thin substrate having two printed conductive ink pads. This method is said to be suitable for mass production of radio frequency identification tags (RFIDs) by mounting ICs on interposers that are then physically and electrically connected to the antenna sections using a pressure sensitive conductive adhesive. The pressure sensitive conductive adhesive provides a direct electrical connection between the interposer contact pads and the antenna sections.

Another type of prior art RFID inlet manufacture using interposers is based on a technique for manufacturing microelectronic elements as small electronic blocks, associated with Alien Technology Corporation ("Alien") of Morgan Hill Calif. Alien has developed techniques to manufacture small electronic blocks, which it calls "NanoBlocks", and then deposit the small electronic blocks into recesses on an underlying substrate. To receive the small electronic blocks, a planar substrate is embossed with numerous receptor wells 210. The receptor wells are typically formed in a pattern on the substrate. For instance, the receptor wells 210 may form a simple matrix pattern that may extend over only a predefined portion of the substrate, or may extend across substantially the entire width and length of the substrate, as desired. Alien has a number of patents on its technique, including U.S. Pat. Nos. 5,783,856; 5,824,186; 5,904,545; 5,545,291; 6,274,508; and 6,281,038. Further information can be found in Alien's Patent Cooperation Treaty publications, including WO 00/49421; WO 00/49658; WO 00/55915; WO 00/55916; WO 00/46854 and WO 01/33621.

As noted above, RFID inlets using interposers provide an inherent advantage in high speed manufacture by facilitating effective mechanical and electrical connection of ICs to antennas. However, other substantial manufacturing problems must be solved in order to provide an efficient inlay production process using interposers. U.S. Published Patent Application No. 2003/0136503 A1, commonly assigned herewith, discloses processes for producing RFID interposers and attaching the interposers to an antenna web. The interposers are severed or separated from a webstock or sheetstock with densely packed IC's (i.e. small pitch between adjacent ICs) and interposer leads. The interposers are then transported, "indexed" (spread apart), and affixed in sequence to a webstock containing antennas that are typically spaced at a much higher pitch.

Other patent publications disclosing systems for attaching interposers to antennas to form RFID transponders include for example: US Patent Application 2004/0089408 A1 (connecting micro-chip modules to antennas via release from a carrier tape, then crimping or soldering to the antennas); Japanese Patent Application No. JP 2003 281491 A (mounting the interposer to circuits using an electronically controlled, rotating transport members); and PCT publication WO 2005/076206 A 1 (continuous production of electronic film components by placing chip modules on antenna connections of antenna film sections).

Increases in demand for RFID labels and tags have necessitated substantial increases in production capacity. It will be appreciated that higher production rates and lower costs for RFID devices would be desirable.

SUMMARY OF THE INVENTION

According to an aspect of the invention, a method of making RFID devices includes using a variable-speed feeder to cyclically feed a free end of an interposer web into a cutting region. Individual interposers singulated in the cutting region are transported for attachment to antennas on an antenna web. The transportation may be from a rotary transporter, such as a rotary vacuum/anvil device. The cutting of the interposer web may include butt cutting single interposers for eventual connection to the antenna web.

According to another aspect of the invention, a method of cutting interposers from an interposer web includes using a multi-blade cutter to singulate an interposer, as well as to optionally cut unusable interposers or extra web material away to be discarded. The extra material or unusable interposers may be removed from a cutting region using a suitable vacuum device, such as a vacuum chute.

According to yet another aspect of the invention, a method of forming an RFID device includes the steps of: feeding a free end of an interposer web into a cutter, wherein the feeding includes moving the free end with a non-constant speed; butt cutting an interposer from the free end of the interposer web onto a rotary transport mechanism; transporting the interposer on the rotary transport mechanism; transferring the interposer from the rotary transport mechanism to a moving antenna web; and attaching the interposer to the antenna web, such that the interposer is operatively coupled to an antenna of the antenna web.

According to still another aspect of the invention, a method of making RFID devices includes the steps of: feeding portions of a free end of an interposer web into a cutter, wherein the feeding includes feeding an interposer of the interposer web and selectively feeding additional material at the free end of the interposer web; cutting, in an iterative process, the interposer and the additional material, if any, from the free end of the interposer web onto a rotary transport mechanism; transporting the interposer on the rotary transport mechanism; transferring the interposer from the rotary transport mechanism to a moving antenna web; and attaching the interposer to the antenna web, such that the interposer is operatively coupled to an antenna of the antenna web.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the accompanying drawings, which are not necessarily to scale.

DETAILED DESCRIPTION

A method of making RFID devices includes feeding in an interposer web or sheet at a variable (non-constant) speed, cutting single interposers from the interposer web or sheet, and using a rotary transport device to transport the singulated (cut) interposers to an antenna web. The interposers are transferred from the rotary transport device and are attached to the antenna web, being operatively coupled to antennas on the antenna web. The interposers each include an RFID transponder chip and conductive leads. The rotary transport device may be a vacuum anvil that acts as an anvil to aid cutting of the interposers from the interposer web, and uses suction to keep the interposers coupled to the rotary transport device. A feeder is used to advance the interposer web or sheet into a cutting zone between the rotary cutter and the rotary transport device. The rotary cutting device may be capable of singulating multiple interposers at one time, and the system may be capable of thus being able to remove interposers that are not to be joined to the antenna web, for instance interposers that have failed testing, thereby removing these unwanted interposers.

Figure 1:
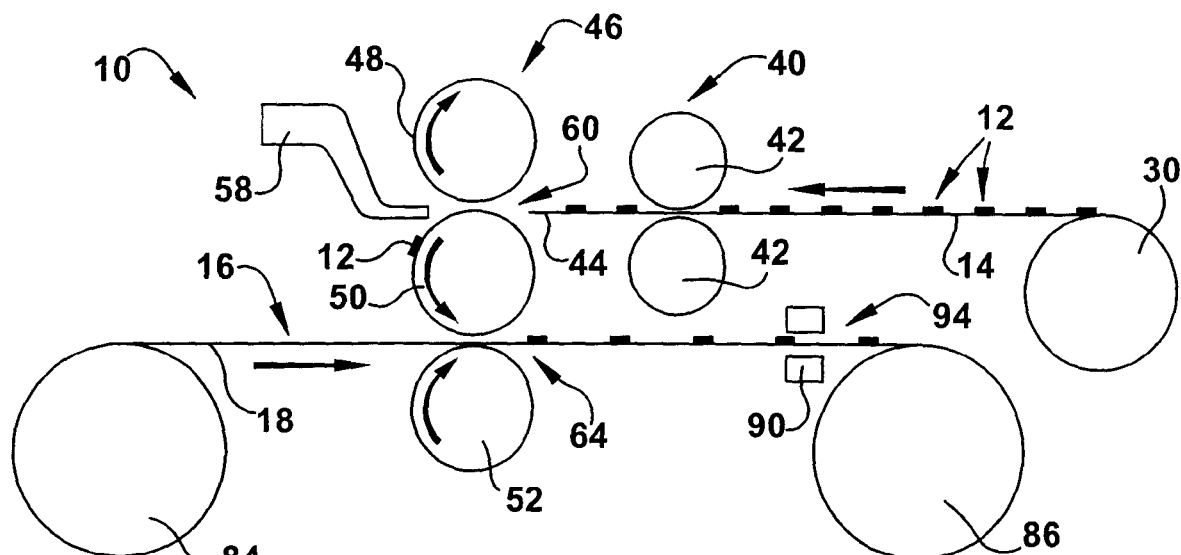
FIG. 1 is a schematic view of an RFID device fabrication system in accordance with the present invention.
Figure 2:
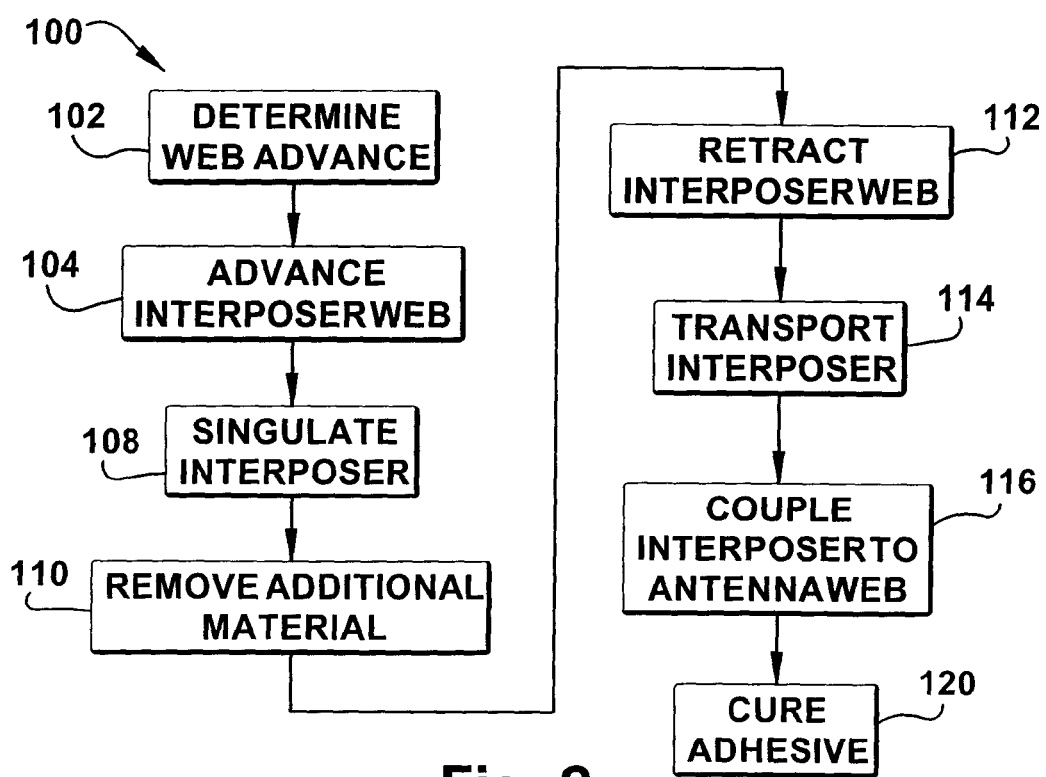
FIG. 2 is a high-level flowchart showing some steps of a method for making RFID devices, using a system such as that shown in FIG. 1, in accordance with the present invention.

FIG. 1 shows a fabrication system 10 for fabricating RFID devices, and FIG. 2 shows some steps of a method 100 that uses the fabrication system 10 in order to make RFID devices. The general goal of the system 10 and the method 100 is to cut or otherwise singulate interposers 12 of an interposer web 14, and attach the interposers 12 to operatively couple the interposers 12 to antennas 16 on an antenna web 18. Thus RFID devices 20 are produced, with each of the devices 20 including an interposer 12 coupled to an antenna 16.

Figure 3:
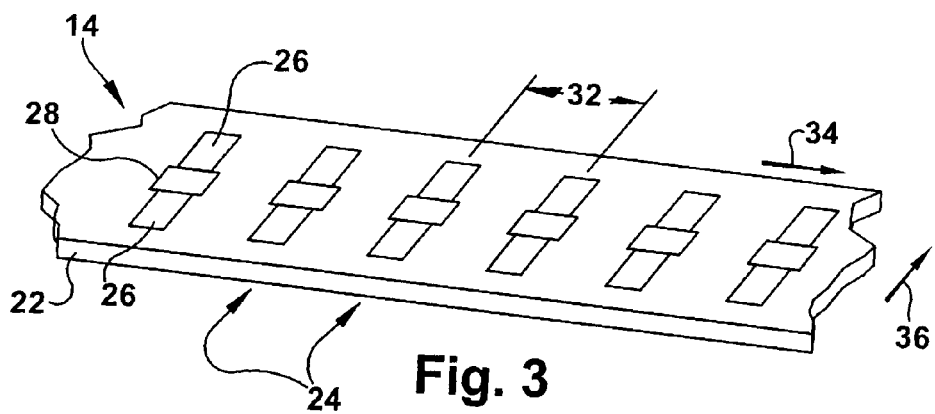
FIG. 3 is an oblique view showing a portion of the interposer web of FIG. 1.

FIG. 3 illustrates one example of the interposer web 14 consisting of a plurality of the interposers 12. The interposer web 14 includes an interposer substrate 22. Each of the interposers 12 includes a substrate section 24 of the substrate 22, upon which are located conductive leads 26 and an RFID transponder chip 28.

The term "interposer," as used herein, may refer to an integrated circuit (IC) chip, electrical connectors to the chip, and interposer leads coupled to the electrical connectors. An interposer also may include an interposer substrate, as described above, which may support other elements of the interposer, and may provide other characteristics such as electrical insulation. The interposer may be elongate, as the interposer leads extend from the IC chip. The interposer may be flexible, rigid, or semi-rigid. It will be appreciated that a variety of interposer configurations are available for coupling to antennas. Examples include an RFID interposer available from Alien Technology Corporation, and the interposer marketed under the name I-CONNECT, available from Philips Electronics. Further disclosures of interposers are found in U.S. Pat. No. 6,606,247, assigned to Alien Technology Corporation, and in U.S. Patent Publication No. 2003/0136503 A1.

The interposer substrate 22 may be any of a variety of suitable materials. Examples of suitable materials include high Tg polycarbonate, poly(ethylene terephthalate), polyarylate, polysulfone, a norbornene copolymer, poly phenylsulfone, polyetherimide, polyethylenenaphthalate (PEN), polyethersulfone (PES), polycarbonate (PC), a phenolic resin, polyester, polyimide, polyetherester, polyetheramide, cellulose acetate, aliphatic polyurethanes, polyacrylonitrile, polytrifluoroethylenes, polyvinylidene fluorides, HOPEs, poly(methyl methacrylates), or a cyclic or acyclic polyolefin. Other suitable polymer materials may be utilized for the interposer substrate 22. Also, suitable non-polymer materials, such as paper, may also be used for the interposer substrate 22.

In the system 10 shown in FIG. 1 the interposer web 14 is shown as a roll material, being unwound from an interposer web supply roll 30. It will be appreciated that the interposer web 14 alternatively may be a suitable interposer sheet material, being provided in a plurality of distinct sheets.

The interposer web 14 illustrated in FIG. 3 is shown having a single lane of the interposers 12, located adjacent to one another at an interposer pitch 32 in a down-web direction 34. As used herein, the "pitch" of elements on a webstock or sheetstock means the center-to-center distance between adjacent elements. A lower pitch (less distance between adjacent elements) is sometimes referred to as a higher density pitch, and vice versa.

It will be appreciated that alternatively, the interposer web 14 may have multiple lanes of interposers in a cross-web direction 36. Suitable splitting operations may be utilized, if desired, to separate a multi-lane into single lanes, prior to cutting or otherwise singulating the interposers 12.

A feeder 40 is used to advance the interposer web 14, for instance moving the web by rotation of feeder rollers 42, which press upon and grip the interposer web 14. In step 102 of the method 100, a determination is made regarding the amount of a free end 44 of the interposer web 14 that is to be advanced for the next cut. As explained below in greater detail, the system 10 may be configured to cut multiple of the interposers 12 when a single cut is made on the interposer web 14. This may allow for interposers that have failed testing or otherwise not to be used, to be removed and discarded during the cutting process. Information regarding the location of unusable of the interposers 12 may be used to control the feeder 40 to advance an extra amount of the interposer web 14, when required to allow removal of unusable of the interposers 12.

In step 104 of the method 100 the feed rollers 42 or other components of the feeder 40 are used to advance the desired amount of the free end 44 of the interposer web 14. This advancement of the interposer web 14 may be made at a variable, non-constant speed. The rotation of the feeder rollers 42 may speed up and slow down to feed different amounts of the interposer web 14, and/or as part of the cyclic process of feeding the interposer web 14.

In step 108, one of the interposers 12 is singulated from the interposer web 14 at a cutter/transporter 46. The cutter/transporter includes a rotary cutter 48, a rotary transporter 50, and a roller 52. The free end 44 of the interposer web 14 is cut between the rotary cutter 48 and an anvil that is part of the rotary transporter 50. The cutting may be butt cutting of the interposer web 14, singulating one of the interposers 12 from the free end 44 of the interposer web 14, without leaving any matrix of the material behind on the interposer web 14. It will be appreciated that use of butt cutting advantageously avoids having to deal with any remaining matrix material of the interposer web 14. However, it will be appreciated that other cutting methods, such as die cutting, shear cutting, or laser cutting, may alternatively be employed to singulate the interposer 12.

Optionally, a suction chute 58 may be positioned in proximity to a cutting region 60. The suction chute 58 may be used to receive and remove additional material that is cut from the interposer web 14. The removal of this additional material may occur in step 110 of the method 100. The additional material may include additional interposers that are not to be attached to the antenna web 18, for instance additional interposers that have been already identified as unsuitable for use, such as by failing earlier-performed testing. Alternatively or in addition, the additional material may include superfluous material from the interposer web 14, for instance material located between adjacent of the interposers 12 on the interposer web 14.

Following cutting at the free end 44 of the interposer web 14, the feeder 40 may retract the interposer web 14, in step 112. In high-speed operation, the interposer web 14 may overshoot the cutting region 60 for inertial reasons, and may need to be retracted by the feeder 40 prior to the next cutting operation.

In step 114 of the method 100, the singulated interposer 12 is transported on the rotary transporter 50 from the cutting region 60 to an attachment region 64. As explained in greater detail below, the rotary transporter 50 may be a vacuum anvil device that includes locations that serve as an anvil during the cutting operation performed in the cutting region 60. Vacuum ports may also be located at the same locations along the rotary transporter 50, enabling the singulated interposers 12 to be sucked toward and held against the rotary transporter 50. As the rotary transporter 50 turns, the singulated interposers 12 are moved along to the attachment region 64, where the interposers 12 are attached to individual antenna 16 of the antenna web 18.

Figure 4:
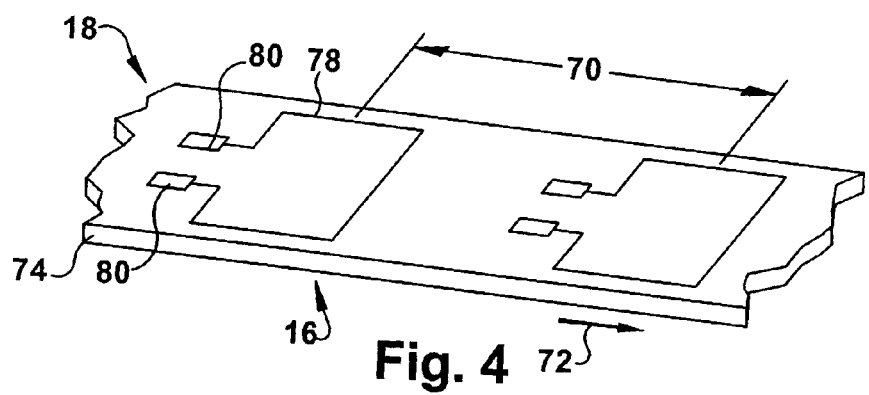
FIG. 4 is an oblique view showing a portion of the antenna web of FIG. 1.

FIG. 4 shows one example of the layout of the antenna web 18, with multiple antennas 16 spaced at an antenna pitch 70 in a down-web direction 72. The antenna web 18 includes an antenna web substrate 74 upon which conductive antenna patterns 78 of the antennas 16 rest. The conductive antenna patterns 78 may be made by any of a variety of suitable processes for forming conductive patterns. The antenna conductive patterns may be made from, for example, copper, silver, aluminum or other thin conductive material (such as etched or hot-stamped metal foil, printed conductive ink, etched metal, sputtered metal, etc.). It will be appreciated that a wide variety of suitable antenna patterns are known.

Besides the conductive antenna patterns 78, each of the antennas 16 may include one or more adhesive pads 80 for securing the singulated interposers 12 to the antenna web 18. The adhesive pads 80 may include any of a variety of conductive or non-conductive adhesives. The adhesive pads 80 may include pressure sensitive adhesives, conductive epoxy adhesives, and/or heat-curable adhesives. A wide variety of permanent pressure sensitive adhesives and heatcurable adhesives are well known in the art. The pressure sensitive adhesive may be one of any number of different types of adhesives, such as acrylic and elastomeric pressure sensitive adhesives.

The antenna web substrate 74 may include any of a variety of suitable substrate materials, such as the materials mentioned above with regard to the interposer web substrate 22.

The antenna web 18 may be a roll material, which may be supplied in an antenna web supply roll 84. The antenna web 18 may be moved at a substantially constant velocity to a take-up roll 86. As the antenna web 18 passes between the rotary transporter 50 and the roller 52, the singulated interposers 12 held by the transporter 50 may be released onto the antenna web at suitable positions relative to the antenna 16, in step 116. The release may be caused by the interposer 12 adhering to the adhesive pads 80 on the antenna web substrate 18. Alternatively other methods may be used to release the singulated interposers 12 from the rotary transporter 50 to the antenna web 18. For instance a release of the vacuum suction holding the singulated interposer 12 to the rotary transporter 50 may be utilized to release the interposer 12.

Following release of the interposer 12 onto the antenna web 18, in the attachment region 64, there may be a need to cure the adhesive in step 120, at a curing station 90 of the system 10. For heat-curable adhesives, suitable heating may be provided at the curing station 90. The completed web of RFID devices 94 may be wound up in the take-up roll 86.

Figure 5:
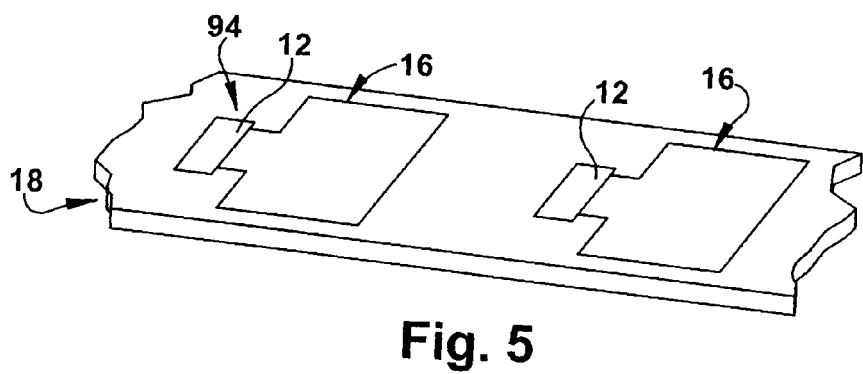
FIG. 5 is an oblique view showing a portion of a web of RFID devices made using the system of FIG. 1, and by the method of FIG. 2.

FIG. 5 shows the RFID devices 94, with the singulated interposers 12 attached to and operatively coupled to the antennas 16. The interposers 12 may be coupled in a face-down configuration with the conductive leads 26 towards and/or in contact with the conductive antenna pattern 78. Alternatively, as illustrated in FIG. 5, the interposers 12 may be coupled in a face-up configuration, with interposer substrate sections 24 between the conductive leads 26 and the conductive antenna pattern 78. It will be appreciated that various types of electrical coupling may be provided between the conductive leads 26 of the interposer 12, and the antenna conductive patterns 78 of the antennas 16. Various mechanisms may be used to make a direct electrically or ohmically conductive connection between the interposer conductive leads 26 and the antenna conductive patterns 78. Alternatively, other sorts of electrical couplings, such as capacitive coupling and/or magnetic coupling, may be used to operatively electrically couple the interposer conductive leads 26 and the antenna conductive patterns 78.

Considering now exemplary dimensions, presented by way of example and not limitation, in one label embodiment, the section is approximately 7-8 mils thick, and the antenna coating is about 5-10 microns (0.2-0.4 mils). The antenna may be coated on a plastic film such as Mylar, having a thickness of approximately 2-5 mil. The thickness of this particular label embodiment, including a release-coated backing sheet, is between approximately 15-20 mils.

It will be appreciated that the web of the RFID devices 94 may be processed further, as appropriate, to add layers or other features to make RFID labels and/or tags. For example additional adhesive layers may be added, additional protective or writable coatings or layers may be added, etc. Additional processing steps may be performed as part of the same roll-to-roll operation that includes coupling of the interposers 12 to the antennas 16. Alternatively, the additional operations may be performed in one or more different processes. Included in such processes may be separation of the individual RFID devices from a web of such devices, and ultimate coupling of RFID devices to suitable objects.

FIGS. 6-10 schematically illustrate, in greater detail, steps in the singulating of an interposer 12 from the interposer web 14, and transporting and attaching the interposer 12 to the antenna web 18.

Figure 6:
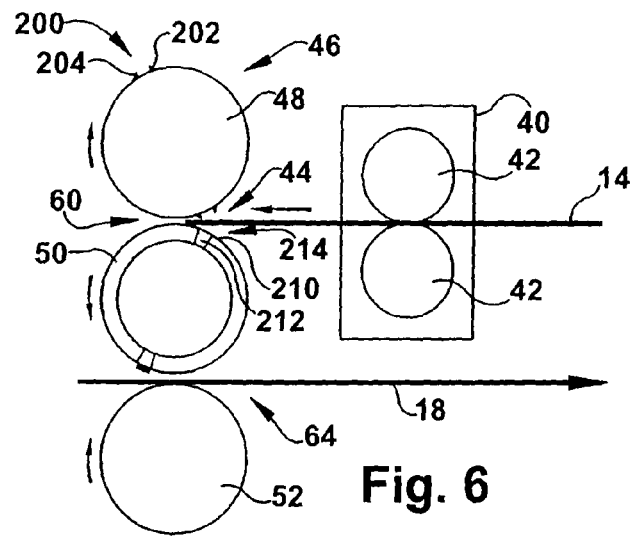
FIG. 6 is a side schematic view showing a first step in a cutting and attaching process using the system of FIG. 1.

FIG. 6 shows the free end 44 of the interposer web 14 approaching the cutting region 50. The interposer web 14 is advanced by the feeder rollers 42 of the feeder 40. As the interposer web 14 is being advanced, the rotary cutter 48 is turning, bringing one of the cutting blade sets 200 into position to singulate one of the interposers 12 from the interposer web 14. As illustrated, the rotary cutter 48 has two cutting blade sets 200, each including a leading cutting blade 202 and a trailing cutting blade 204. In the illustrated embodiment the two cutting blade sets 200 are diametrically opposed from one another. It will be appreciated that the rotary cutter 48 may alternatively have a different number of cutting blade sets 200. It would be expected that the cutting blade sets 200 would be circumferentially evenly spaced about the rotary cutter 48.

Figure 7:
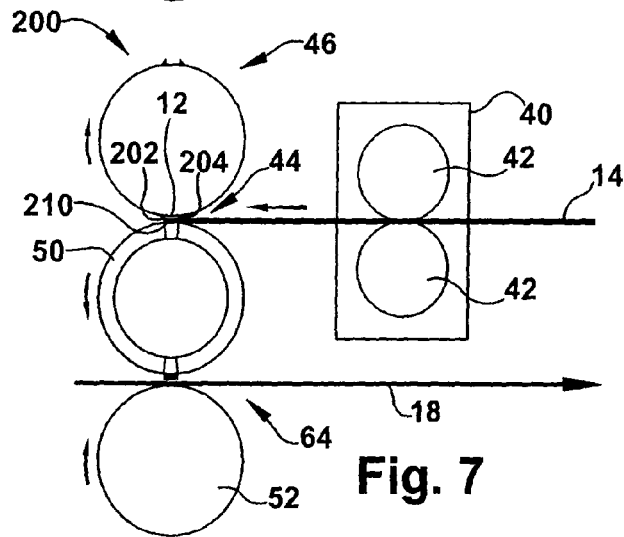
FIG. 7 is a side schematic view showing a second step in a cutting and attaching process using the system of FIG. 1.

FIG. 7 illustrates the actual cutting operation to singulate the interposer 12 from the free end 44 of the interposer web 14. The trailing blade 204 of the cutting blade set 200 makes contact with the interposer web 14 as the interposer web 14 is pressed against an anvil 210 of the rotary transporter 50. The anvil 210 is positioned around a vacuum nozzle 212 through which a vacuum is maintained in order to releasably secure the cut interposer 12 to the rotary transporter 50. Together, the anvil 210 and the vacuum nozzle 212 constitute a receiving station 214 for receiving and transporting the singulated interposers 12.

The actual cutting of the interposer 12, which may include butt cutting the interposer 12, is performed by the trailing cutting blade 204. The leading cutting blade 202 may be used for removing additional unusable interposers and/or additional material from the interposer web 14, as part of the same cutting operation.

The free end 44 of the interposer 14 is held against the anvil 210 by the suction provided through the vacuum nozzle 212. Once the interposer 12 is cut or otherwise singulated, the suction through the vacuum nozzle 212 holds the singulated interposer 12 against the rotary transporter 50.

Figure 8:
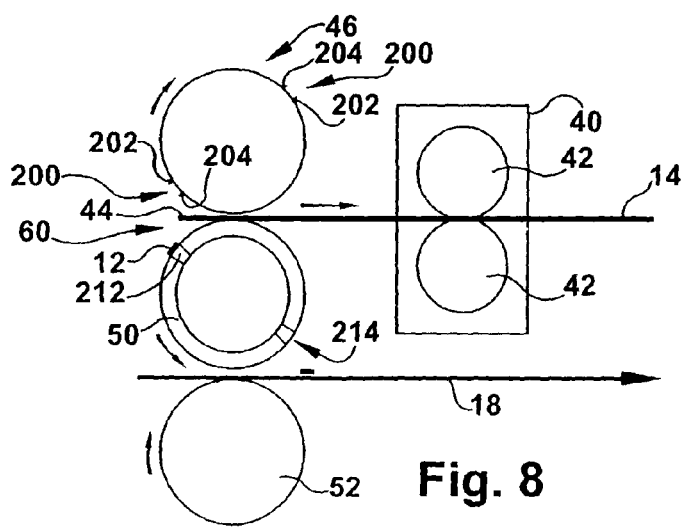
FIG. 8 is a side schematic view showing a third step in a cutting and attaching process using the system of FIG. 1.

FIG. 8 illustrates movement of the singulated interposer 12 on the rotary transporter 50. The rotary transporter rotates in a direction opposite to that of the rotary cutter 48 and the roller 52. The rotary transporter 50 and the roller 52 may act in concert to advance along the antenna web 18. All of the rotary elements of the cutter/transporter 46 (the rotary cutter 48, the rotary transporter 50, and the roller 52) may rotate at substantially constant rates. Alternatively, it will be appreciated that the rotation rates of one or more of the elements may be non-constant. For instance, the rotary transporter 50 may accelerate and decelerate throughout its rotation. As one example, the rotary transporter 50 may be configured to be substantially stationary during the cutting operation to singulate one of the interposers 12, and may accelerate to move at approximately the speed of the antenna web 18 when the interposer 12 is deposited onto the antenna web 18. It will be appreciated that such a non-constant rotation of the rotary transporter 50 may require that none of the stations 214 for receiving and transporting the interposers 12 (consisting of the anvil 210 and suction nozzle 212) are diametrically opposed to other stations 214. Thus there may be an odd number of circumferentially distributed stations 214 about the circumference of the rotary transporter 50. More broadly, it will be appreciated that the sizes, configurations, and rotation rates of the rotary cutter 48, the rotary transporter 50, and the roller 52, may all be suitably selected to attach the interposers 12 at the proper pitch of the antenna web 18.

As shown in FIG. 8, the free end 44 of the interposer web 14 may overshoot the cutting region 60 after the cutting operation has been performed. This overshoot may occur because of inertial forces in accelerating the interposer web 14 to advance it into the cutting region 60 for cutting by the trailing cutting blade 204. It may be desirable to have the interposer web 14 moving during the cutting operation, for example to substantially match the speed of the rotary cutter 48 and/or the speed of the rotary transporter 50. The overshoot may be taken up by retracting the interposer web 14, such as by reversing directions on the feeder rollers 42 of the feeder 40, as is illustrated in FIG. 8. Thus it may be desirable to advance and retract the interposer web 14 cyclically during the cutting and transporting operation.

Figure 9:
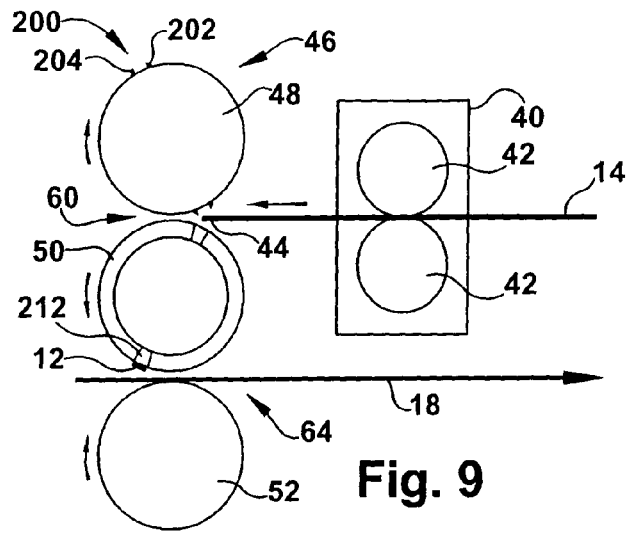
FIG. 9 is a side schematic view showing a fourth step in a cutting and attaching process using the system of FIG. 1.

FIG. 9 shows the interposer web 14 retracted and ready to be advanced again for another cutting operation on the free end 44. Meanwhile, the singulated interposer 12 is advancing toward the attachment region 64.

Figure 10:
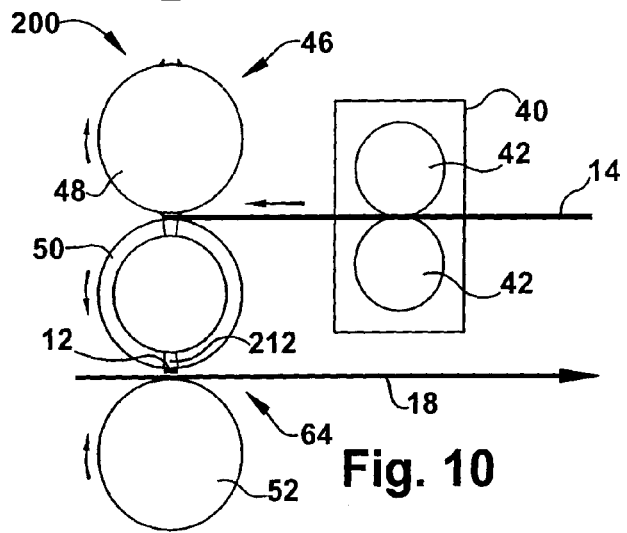
FIG. 10 is a side schematic view showing a fifth step in a cutting and attaching process using the system of FIG. 1.

FIG. 10 shows attachment of the singulated interposer 12 onto the antenna web 18. As described above, the attachment may include an adhesive attachment of the interposer 12 onto the antenna web 18. Alternatively or in addition the vacuum suction on the vacuum nozzle 212 may be reduced or released to aid in releasing the singulated interposer 12 from the rotary transporter 50. For instance, the rotary transporter 50 may be configured such that the vacuum in the vacuum nozzle is reduced or eliminated automatically as the transporter 50 rotates to bring the singulated interposer in contact with the antenna web 18.

Figure 11:
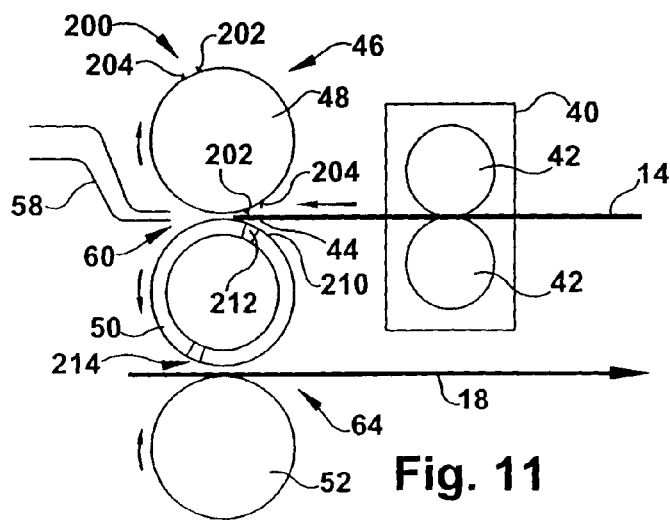
FIG. 11 is a side schematic view showing a first step in another cutting and attaching process using the system of FIG. 1.
Figure 12:
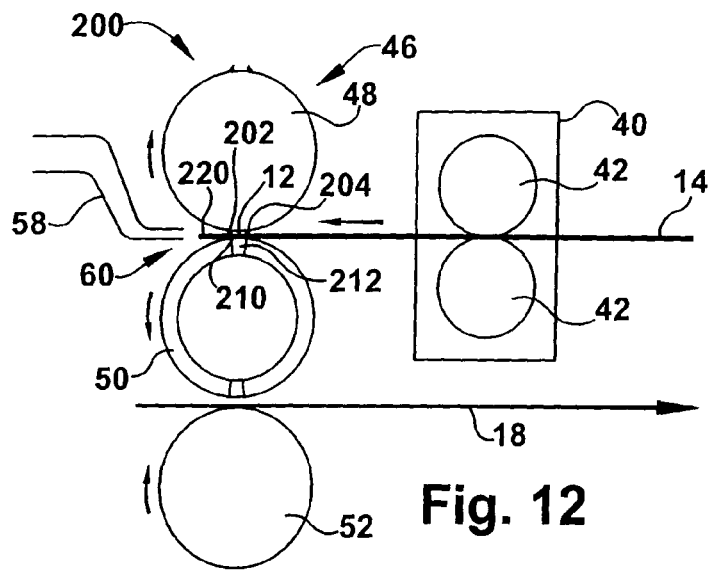
FIG. 12 is a side schematic view showing a second step in the another cutting and attaching process using the system of FIG. 1.
Figure 13:
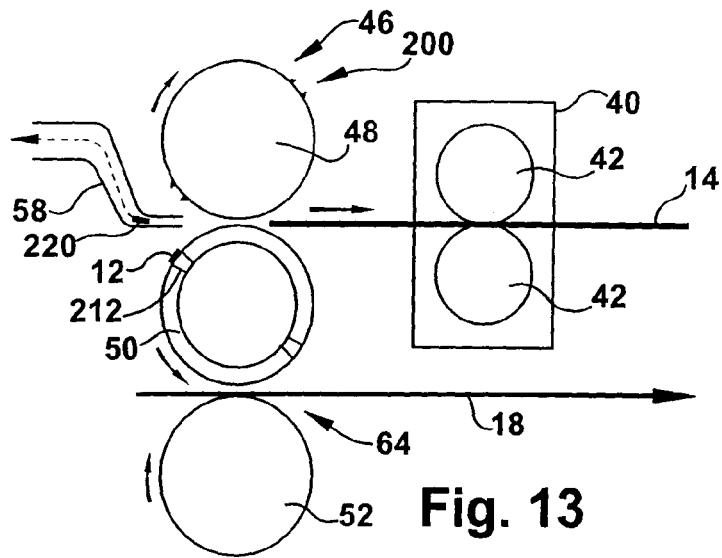
FIG. 13 is a side schematic view showing a third step in the another cutting and attaching process using the system of FIG. 1.

FIGS. 11-13 illustrate a modification of the process, where multiple portions of the interposer web 14 are cut in a single cutting operation. FIG. 11 shows the free end 44 of the interposer web 14 advancing into the cutting region 60 between the rotary cutter 48 and the rotary transporter 50. The suction chute 58 is positioned at a far side of the cutting region 60.

FIG. 12 illustrates the cutting. Both of the cutting blades 202 and 204 of the cutting set 200 butt cut the free end 44 of the interposer web 14, against the anvil 210 of the rotary transporter 50. One cut portion of the interposer web 14 is the singulated interposer 12 between the two cutting blades 202 and 204. The singulated interposer 12 is releasably secured to the rotary transporter 50 by use of the vacuum nozzle 212, in a similar manner to the method shown in FIGS. 6-10 and described above.

An additional cut portion 220 of the interposer web 14 is beyond the front cutting blade 202, at the free end 44 of the interposer web 14. This additional portion 220 is a portion of the interposer web 14 to be discarded. The additional portion 220 may include one or more interposers that are not to be attached to the antenna web 18. For example the additional portion 220 may include one or more interposers that have failed testing, and thus are to be discarded. Alternatively or in addition, the additional portion 220 may include parts of the interposer web 14 that are between adjacent pairs of the interposers 12, and are to be discarded as unnecessary for connection to the antenna web 18.

FIG. 13 illustrates the immediate aftermath of the cutting operation. The singulated interposer 12 is secured to the rotary transporter 50, and is being transported toward the antenna web 18. The joining of the singulated interposer 12 to the antenna web 18 may follow thereafter along the lines described above with regard to FIGS. 9 and 10.

The additional portion 220 is directed into the suction chute 58 and is transported out of the cutting region 60, to be eventually discarded. It will be appreciated that a suitable vacuum source may be used to provide suction for operating the suction chute 58, and to pull the additional portions 220 into the suction chute, and to a location to be eventually discarded.

It will be appreciated that many advantages result from removing unusable of the interposers 12 early in the process, before the failed interposers are connected to the antenna web 18. Once connected to the antenna web 18, greater amounts of material must be discarded, since not only the failed interposer must be discarded, but also the corresponding antenna 16 and part of the antenna web 18 as well. Also, the process illustrated in FIGS. 9-11 avoids the complications that ensue from having to somehow remove failed interposers or RFID devices in a later process step.

The systems and methods described herein allow for connection of interposers having a first pitch to antennas on an antenna web having a second pitch. The feeder 40 may also be used to adjust the amount of advancement of the interposer web 14 to account for variable pitch among the interposers 12 of the interposer web 14, and/or to account for unusable interposers on the interposer web 14. It will be appreciated that information regarding the location of good interposers on the interposer web 14 may be supplied to the feeder 40 by any of a variety of suitable methods. For instance, the feeder 40 may be directly coupled to a test device that examines or tests the interposers 12, with the information on the test results being used to suitably advance the interposer web 14 for butt cutting and use of the next available good interposer 12 on the interposer web 14. Also information on positioning of the interposers 12 on the interposer web 14 may be supplied to the feeder 40. Such information may be obtained by various suitable devices, such as optical scanners that locate the position of the interposers 12 and/or index marks indicating the position of interposers on the interposer web 14. Information regarding the interposers may be provided directly to the feeders 40, or may be provided in the form of various types of suitable computer-readable media.

Figure 14:
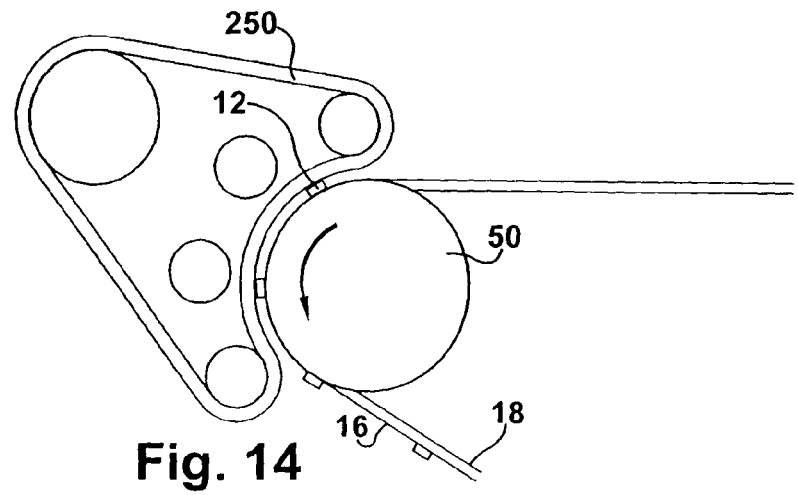
FIG. 14 is a side view of an alternate pressured belt device usable with the system of FIG. 1.

FIG. 14 shows an alternative pressure lamination member 250 that may be substituted in place of the roller 52. The pressure lamination member 250, which may be a metal or polymeric belt, may be used for bonding the interposers 12 on the rotary transporter 50 to the antennas 16 on the antenna web 18. The use of a rotating pressure lamination member 250 provides an extended zone of elevated pressure and/or temperature to facilitate adhesive curing, and formation of a durable, bond between the antenna 16 and the interposer 12. One or more additional set of belt or roller combinations (not shown) can be provided to further extend the zone of bond formation between the antenna 16 and the interposer 12.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making RFID devices, the method comprising:
   feeding portions of a free end of an interposer web into a cutter, wherein the feeding includes feeding an interposer of the interposer web and selectively feeding additional material at the free end of the interposer web;
   cutting, in an iterative process, the interposer and the additional material, if any, from the free end of the interposer web onto a rotary transport mechanism;
   transporting the interposer on the rotary transport mechanism;
   transferring the interposer from the rotary transport mechanism to a moving antenna web; and
   attaching the interposer to the antenna web, such that the interposer is operatively coupled to an antenna of the antenna web.

2. The method of claim 1, wherein cutting includes using a rotary cutter to cut the interposer onto an anvil of the rotary transport mechanism.

3. The method of claim 2, wherein the rotary cutter includes multiple blades configured for contacting different locations on the free end of the interposer web in a single cutting operation and the multiple blades include a leading blade for cutting the additional material, if any; and a trailing blade for cutting the interposer.

4. The method of claim 1, including an additional step of testing the interposer web prior to the step of cutting.

5. The method of claim 1, including an additional step of affixing the interposed to the antenna web after the step of attaching by one of curing, bonding, crimping or the like.

6. The method of claim 1, wherein the feeding is done by a variable speed feeder to cyclically feed the free end of the interposer web into the step of cutting.

7. The method of claim 1, including an additional step of singulating interposers after the step of cutting.

8. The method of claim 1, including an additional step of removing failed interposers after the step of cutting.

9. The method of claim 1, including an additional step of positioning the interposer web in a cutting zone prior to the step of cutting.

10. The method of claim 1, including an additional step of applying an adhesive coated release liner to the antenna web after the step of attaching to form an RFID inlay label stock.

11. A fabrication system for making an RFID inlay intermediate web for use as label stock, comprising;
    an interposer stock having a first pitch, the interposer stock having an integrated circuit provided on a polymeric material;
    a transporter for moving the interposer stock;
    a cutter for separating the interposer stock into individual interposers;
    a tester for testing each of the individual interposers;
    a rotary transporter for accepting the individual interposers and moving the individual transporter an antenna web;
    an antenna web handler for moving the antenna web in proximity to the rotary transporter to receive the individual interposer, the antenna web along with the interposer form an RFID inlay intermediate web having a second pitch distinct from the first pitch; and;
    adhesive applicator for applying an adhesive and release material to the RFID inlay intermediate web to form an RFID inlay label stock.

12. A system as recited in claim 11, wherein the interposer stock is provided in a roll format.

13. A system as recited in claim 11, wherein the interposer stock is provided in a cut sheet format.

14. A system as recited in claim 11, wherein the second pitch is greater than the first pitch.

15. A system as recited in claim 11, wherein the interposer stock is provided with a plurality of lanes of interposers.

16. A system as recited in claim 11, including a removal chute for discarding failed interposers.

17. An RFID device produced in accordance with the method of claim 1.

* * * * *